United States Patent
Lee

(10) Patent No.: US 8,452,563 B2
(45) Date of Patent: May 28, 2013

(54) APPARATUS FOR MEASURING AND CALIBRATING ERROR OF WAFER PROBER

(75) Inventor: Jong-Guk Lee, Suwon-si (KR)

(73) Assignee: Semics Inc. (KR)

( * ) Notice: Subject to any disclaimer, the term of this patent is extended or adjusted under 35 U.S.C. 154(b) by 749 days.

(21) Appl. No.: 12/664,011

(22) PCT Filed: Jun. 11, 2008

(86) PCT No.: PCT/KR2008/003235
§ 371 (c)(1),
(2), (4) Date: Dec. 10, 2009

(87) PCT Pub. No.: WO2008/153301
PCT Pub. Date: Dec. 18, 2008

(65) Prior Publication Data
US 2010/0166291 A1     Jul. 1, 2010

(30) Foreign Application Priority Data
Jun. 11, 2007    (KR) .................. 10-2007-0056448

(51) Int. Cl.
*G06F 19/00*       (2006.01)
(52) U.S. Cl.
USPC ............ 702/94; 702/85; 438/14; 324/750.23; 324/754.03; 324/762.01
(58) Field of Classification Search
USPC ................... 702/94, 85; 438/14; 324/750.23, 324/754.03, 762.01
See application file for complete search history.

(56) References Cited

U.S. PATENT DOCUMENTS
6,096,567 A * 8/2000 Kaplan et al. ................. 438/14

FOREIGN PATENT DOCUMENTS

| JP | 63-229730 | 9/1988 |
|---|---|---|
| JP | 01-243535 | 9/1989 |
| JP | 02-047846 | 2/1990 |
| KR | 10-1999-0062690 | 7/1999 |
| KR | 10-0262654 | 5/2000 |

(Continued)

OTHER PUBLICATIONS

International Search Report—PCT/KR2008/003235 dated Aug. 5, 2008.

*Primary Examiner* — Jonathan C Teixeira Moffat
*Assistant Examiner* — Hien Vo
(74) *Attorney, Agent, or Firm* — Cantor Colburn LLP

(57) ABSTRACT

Provided is an error measurement and correction device of a stage of a wafer prober. The error measurement and correction device includes a jig member, a vision module, a central processing unit, and an interface unit. The jig member is disposed on a chuck on the stage, and the vision module is disposed on an upper plate of the wafer prober disposed at a position facing the jig member to enable the camera of the vision module to acquire images of the patterns of the jig member and transmits the acquired images to the central processing unit. The central processing unit acquires images of the patterns of the jig member disposed on the chuck by using the vision module to extract reference position information, moves the stage at a unit interval of the pattern, acquires images of the patterns of the jig member again to extract measured position information, and generates and stores mapping data by calculating difference between the measured position information and the reference position information. The central processing unit corrects the movement position information on the stage to be moved by using the mapping data when the stage is moved, so that irrespective of physical deterioration of the stage, the stage can be moved to an accurate position.

4 Claims, 9 Drawing Sheets

FOREIGN PATENT DOCUMENTS

| KR | 10-2002-0073709 | 9/2002 |
| KR | 10-2004-0092954 | 11/2004 |
| KR | 10-0445850 | 6/2005 |
| KR | 10-2005-0116960 | 12/2005 |

* cited by examiner (a)

(b)

(a)

(b)

(a)

(b)

APPARATUS FOR MEASURING AND CALIBRATING ERROR OF WAFER PROBER

TECHNICAL FIELD

The present invention relates to an error measurement and correction device of a wafer prober for measuring a degree of physical deterioration of a stage of the wafer prober and correcting the deterioration, and more particularly, to an error measurement and correction device of a wafer prober capable of rapidly and simply measuring a degree of physical deterioration of a stage on the scene without disassembling the wafer prober and accurately correcting a moved position of the stage by using the measured information.

BACKGROUND ART

In general, a semiconductor wafer prober station is one of electrical die sorting (EDS) test equipments used in a semiconductor manufacturing process to electrically test whether or not dies in wafer states can normally operate and detect defects of the dies by contacting probes to the dies in the semiconductor wafers and applying electrical signals thereto before packaging semiconductor chips formed on the semiconductor wafers. The aforementioned wafer prober is a manufacturing equipment for directly contacting and testing a pad of a die formed on a wafer to remove a defective die early and reducing losses of raw materials, time, and the like used in the following packaging and packaging test processes.

FIG. 1 is a front view illustrating a wafer prober station. Referring to FIG. 1, the wafer prober station includes a wafer loader for transferring a semiconductor wafer at a position on a FOUP or a cassette to be tested or on a chuck, a stage for precisely transferring the wafer to contact the wafer to a probe card to be tested, and a tester for testing the wafer disposed on the chuck on the stage. A header of the tester is mounted with the probe card and applies an electrical signal to the die on the wafer by using the probe card to measure the result and detect defects of each die.

The stage of the wafer prober station needs to be precisely controlled in x, y, and z directions. The stage is basically formed in a straight direction. However, the stage may be physically deteriorated in units of micron that is a control unit of the stage. In addition, operations of the stage have to be controlled in units of micron. However, due errors of a control encoder mounted at both sides of the stage, precise control is not easy. In addition, in a case where the stage has been operated for a long period or applied with an external impact, precision of the stage is easily decreased.

As described above, in order to measure a degree of the physical deterioration of the stage and calibrate the stage with physical deterioration, a laser measuring method is conventionally used. However, since a laser measurer used in the laser measuring method is a device sensitive to surroundings, in order to calibrate the stage, an additional repairing space having a predetermined condition is needed, and parts of the wafer prober system have to be disassembled, so that calibration takes much time. Therefore, when problems occur while using devices, the devices have to be transferred to the additional repairing space so as to be repaired, so that additional costs and time are needed.

Therefore, it is proposed a device which can reduce a time to measure errors that occur due to the deterioration of the stage and have a simple structure to be easily transferred and stored.

DISCLOSURE

Technical Problem

The present invention provides an error measurement and correction device which can rapidly measure and correct physical errors of a stage of a wafer prober or errors of a control encoder on the scene by using a vision processing method.

The present invention also provides an error measurement and correction device which can simply measure errors due to physical deterioration of a stage or the like without disassembling a wafer prober.

The present invention also provides an error measurement and correction device which can transfer stages that have physical deterioration errors to an accurate position by generating and managing mapping data on the moved position of the stages.

Technical Solution

According to an aspect of the present invention, there is provided an error measurement and correction device for measuring and correcting errors of a stage of a wafer prober having physical deterioration, including: a jig member having a surface on which patterns having the same shape are repeatedly formed; a vision module having a base substrate and one or more cameras mounted on the base substrate; a central processing unit acquiring one or more images of the patterns of the jig member by using the vision module, extracting errors of a position of the stage on which the jig member is disposed by using the images of the patterns received from the vision module, and correcting the position of the stage to be moved by using the errors and providing the corrected position to a control encoder of the stage; and an interface unit connected between the vision module and the central processing unit to drive a particular camera of the vision module according to an instruction received from the central processing unit or transmit images transmitted from the particular camera of the vision module to the central processing unit, wherein the jig member is disposed on a chuck on the stage, and wherein the vision module is disposed on an upper plate of the wafer prober disposed at a position facing the chuck to enable the camera of the vision module to pick up the patterns of the jig member on the chuck and transmit the picked images to the central processing unit.

In the above aspect of the present invention, the central processing unit may acquire images of the jig member disposed on the chuck from the vision module to extract reference position information by analyzing the acquired images, move the stage at a unit interval of the pattern of the jig member, acquire images of the jig member again, extracts measured position information by analyzing the acquired images, generate mapping data by calculating differences between the reference position information and the measured position information, and store the generated mapping data in a data storage unit. In addition, when the stage is to be moved, the central processing unit may read the mapping data from the data storage unit, correct the movement position information on the stage by using the read mapping data, and move the stage according to the corrected movement position information In addition, the error measurement and correction device may use a wafer in which patterns having the same shape are repeatedly formed s the jig member.

According to another embodiment of the present invention, there is provided an error measurement device for measuring errors of a stage of the wafer prober, including: a jig member having a surface on which patterns having the same shape are repeatedly formed; a vision module having a base substrate and one or more cameras mounted to the base substrate; a central processing unit acquiring one or more images of the patterns of the jig member by using the vision module, extracting errors of a position of the stage on which the jig member is disposed by using the images of the patterns received from the vision module, and correcting the position of the stage to be moved by using the errors and providing the corrected position to a control encoder of the stage; and an interface unit connected between the vision module and the central processing unit to drive a particular camera of the vision module according to an instruction received from the central processing unit or transmit images transmitted from the particular camera of the vision module to the central processing unit, wherein the jig member is disposed on a chuck on the stage, and wherein the vision module is disposed on an upper plate of the wafer prober disposed at a position facing the chuck to enable the camera of the vision module to pick up the patterns of the jig member on the chuck and transmit the picked images to the central processing unit.

In the above aspect of the present invention, the central processing unit of the error measurement device having the aforementioned features may acquire images of the jig member disposed on the chuck from the vision module to extract reference position information by analyzing the acquired images, move the stage at a unit interval of the pattern of the jig member, acquire images of the jig member again, extract measured position information by analyzing the acquired images, generates mapping data by calculating differences between the reference position information and the measured position information, and store the generated mapping data in a data storage unit.

Advantageous Effects

According to the present invention, in a case where a stage of a wafer prober has torsion and errors occur, or a control encoder for controlling the stage has errors, without disassembling corresponding parts of the wafer prober, errors of the stages can be rapidly measured and corrected.

In addition, since a conventional measurer is easily affected by a space or an environment, in order to repair the measurer, the measurer has to be moved to an additional repairing space having a predetermined condition. However, the measurement device according to the present invention is portable and not affected by environmental causes, so that errors of the measurement device according to the present invention can be measured at a position at which the wafer prober is disposed. As a result, problems of the wafer prober can be rapidly corrected.

In addition, according to the present invention, errors due to deterioration of the stage are measured by using a vision processing method, so that error measuring time can be significantly reduced.

In addition, the measurement device can be easily mounted to a predetermined area of a wafer prober to be used, so that the wafer prober does not need to be disassembled, and productivity can be improved and maintenance and repair are easy.

BEST MODE

Hereinafter, structures and operations of an error measurement and correction device used for a stage of a wafer prober according to exemplary embodiments of the present invention will be described in detail with reference to the attached drawings.

Figure 1:
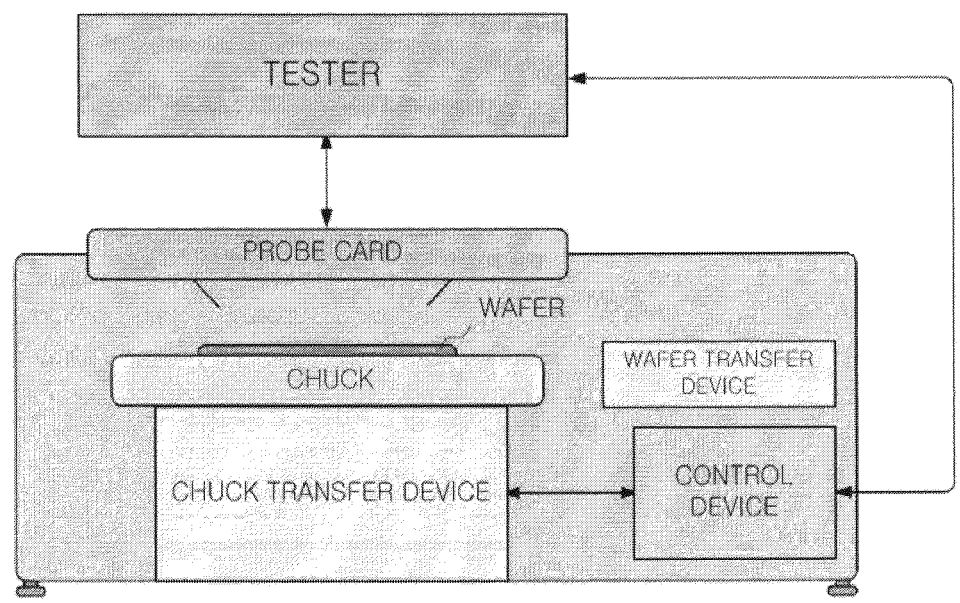
FIG. 1 is a structural view illustrating a general wafer prober station.
Figure 2:
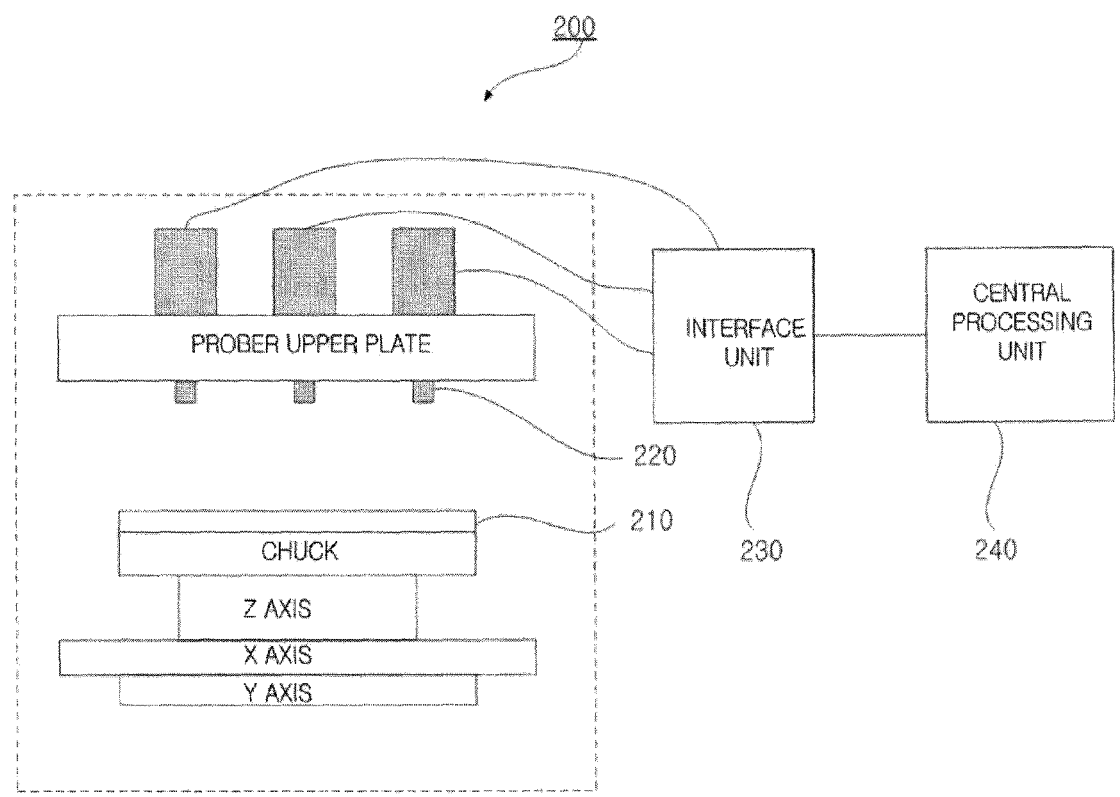
FIG. 2 is a cross-sectional view illustrating a wafer prober on which an error measurement and correction device is mounted according to an embodiment of the present invention.

FIG. 2 is a structural view illustrating a state of measuring errors for the stage of the wafer prober by using the error measurement and correction device used for the stage of the wafer prober according to an embodiment of the present invention. Referring to FIG. 2, components of the error measurement and correction device according to the present invention are mounted on corresponding areas of the wafer prober to measure errors such as flatness and torsion of the stage of the wafer prober, generate mapping data by using the measured errors, correct a position of the stage to be moved by using the mapping data when the stage is moved, and accurately move the stage.

Referring to FIG. 2, the error measurement and correction device 200 according to the present invention includes a jig member 210, a vision module 220, an interface unit 230, and a central processing unit 240.

Figure 3:
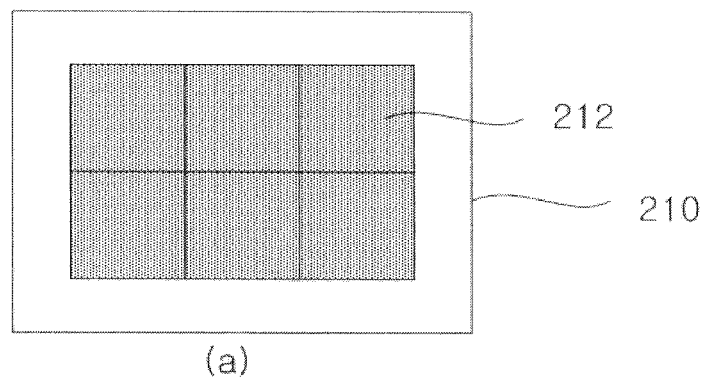
FIG. 3 is a top plan view illustrating examples of a jig member of the error measurement and correction device according to the embodiment of the present invention.
Figure 3:
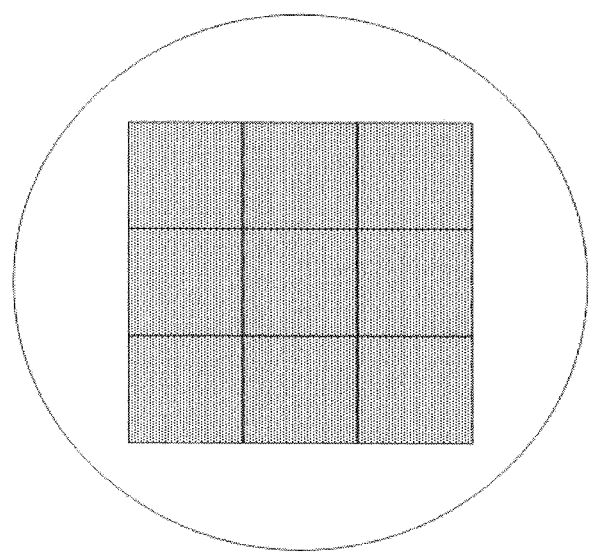

The jig member 210 is a member disposed on a chuck of the stage and has a surface on which patterns having the same shape are repeatedly formed. FIGS. 3a and 3b illustrate examples of the jig member in which the patterns 212 having the same shape are repeatedly formed. Shape, material, thickness, and the like of the jig member 210 may be modified in various manners and the shape of the patterns formed on the surface may be modified. Therefore, as illustrated in FIG. 3b, the jig member 210 is used by repeatedly forming the patterns having the same shape on a surface of a general wafer. Therefore, a wafer having patterns that are repeatedly formed may be used.

Figure 4:
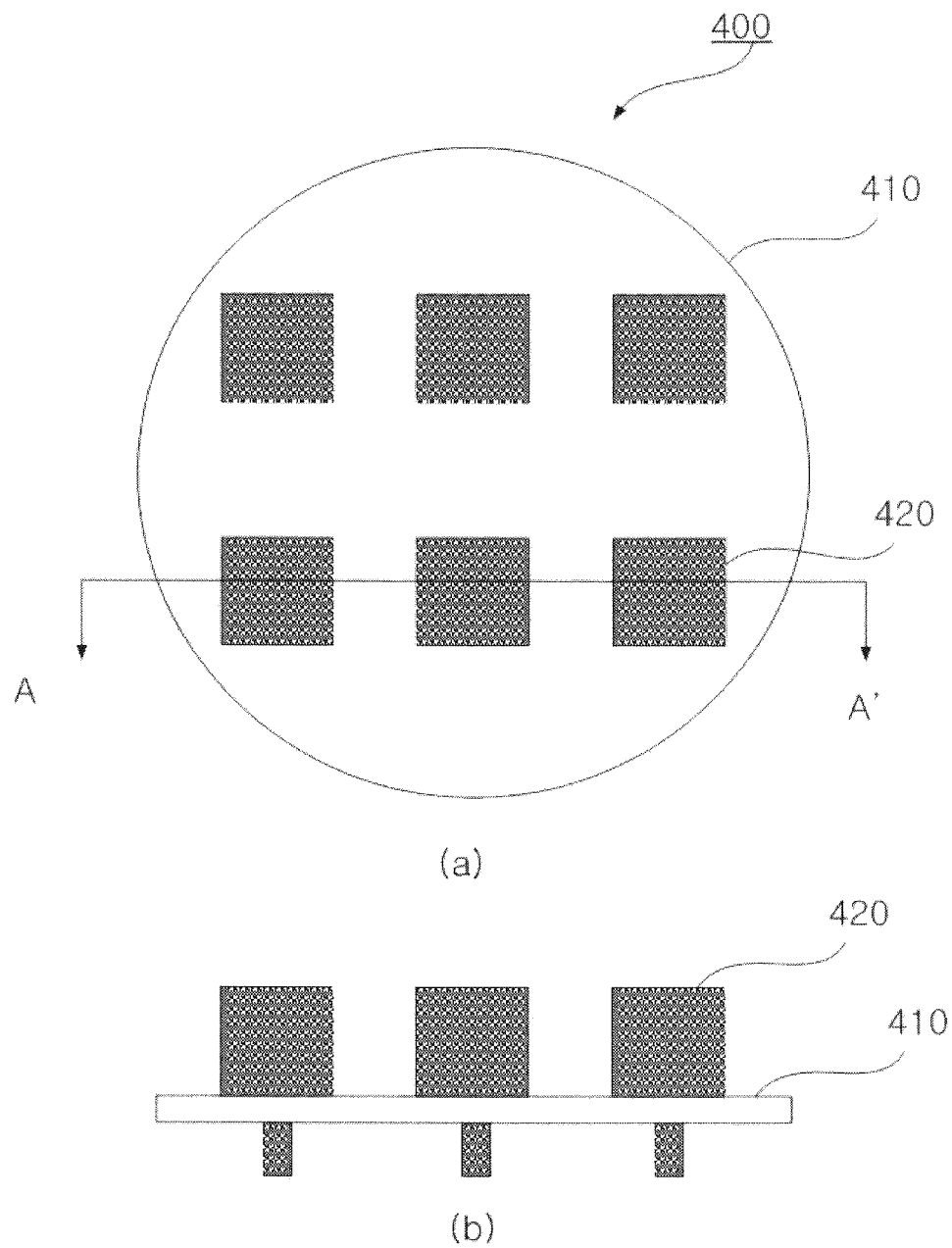
FIGS. 4 and 5 are cross-sectional and top plan views illustrating examples of a vision module of the error measurement and correction device according to the embodiment of the present invention.
Figure 5:
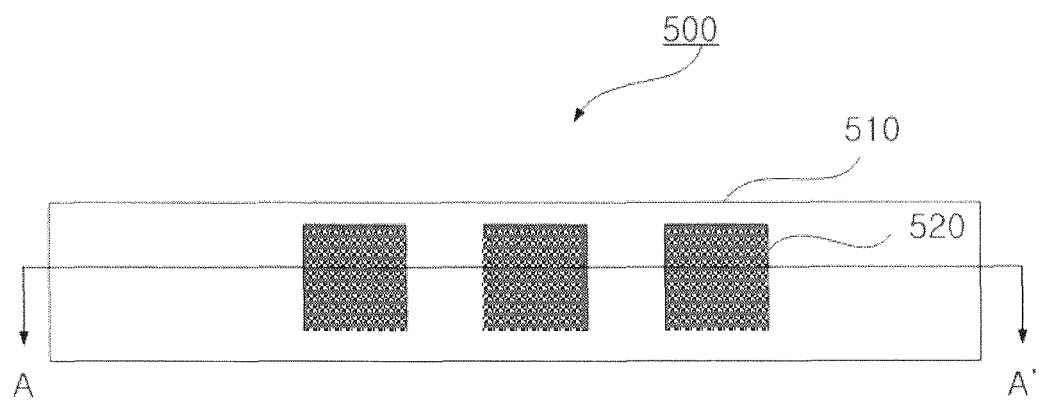
Figure 5:
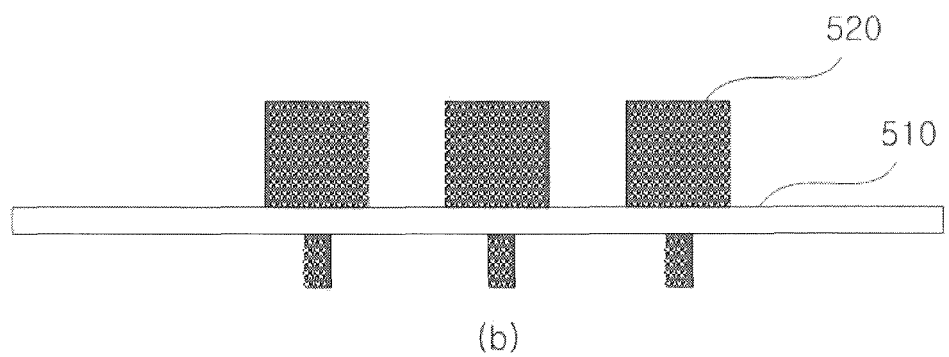

The vision module 220 includes a base substrate 222 and one or more cameras 224 mounted on the base substrate 222. FIGS. 4 and 5 are views illustrating examples of the vision module according to the present invention. The vision module 220 may further include a light disposed at a position adjacent to a camera.

Referring to FIG. 4, an example of the vision module 400 may include a base substrate 410 having a shape similar to that of the wafer and a number of cameras 420 mounted to predetermined positions on the base substrate 410. Referring to FIG. 5, another example of the vision module 500 may include a base substrate 510 having a rectangular shape and a number of cameras 520 mounted to predetermined positions on the base substrate 520. The aforementioned vision module is fixed to an upper plate of the wafer prober to perform error measurement on the wafer prober. Here, one from among the examples of the vision module may be selected to be fixed to the upper plate of the wafer prober to measure errors or the illustrated examples of the vision module may be combined to measure errors.

Figure 6:
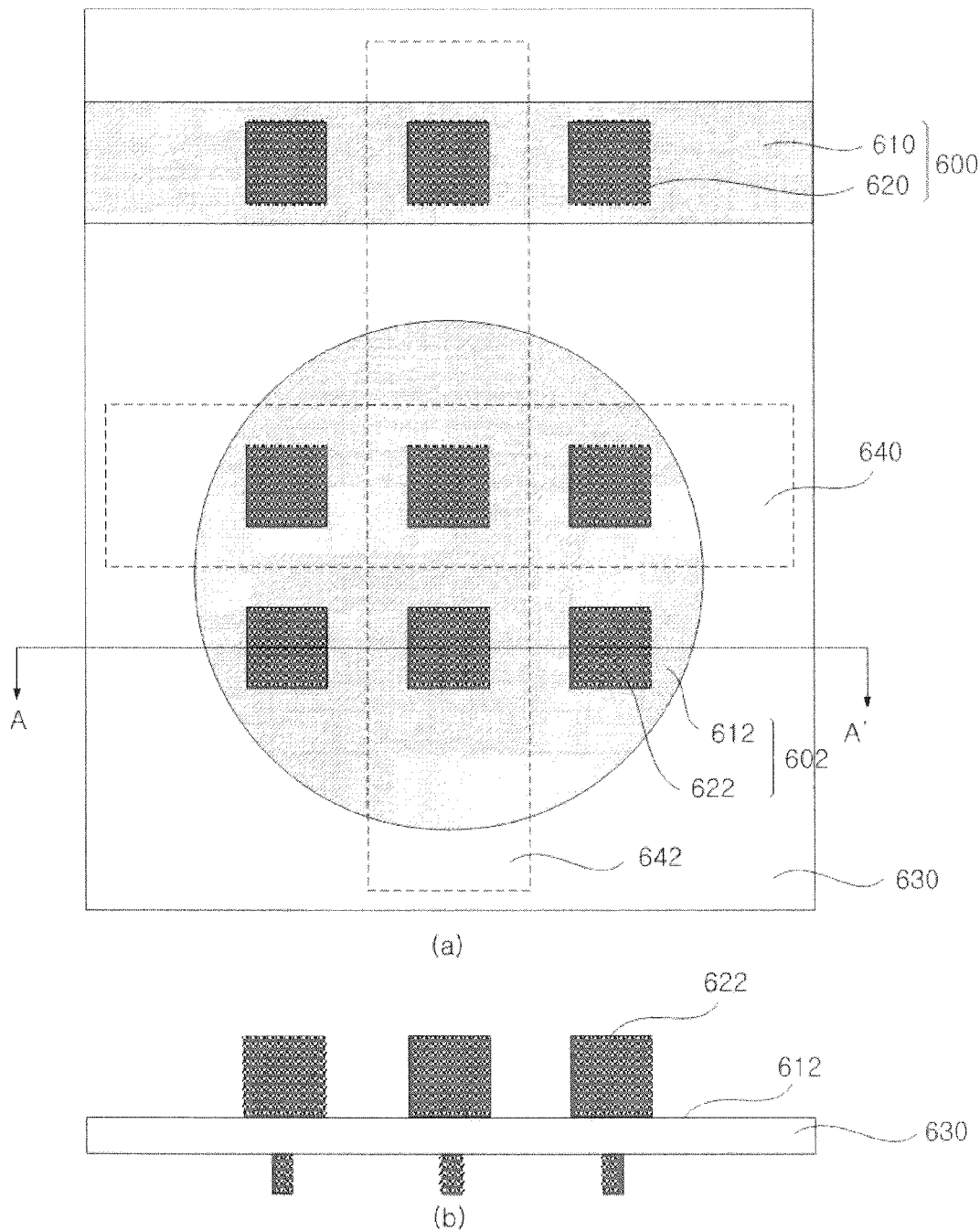
FIG. 6 is a cross-sectional and top plan view illustrating an example of the vision module of the error measurement and correction device, which is mounted on an upper plate of the prober according to the embodiment of the present invention.

FIG. 6 is cross-sectional and top plan view illustrating a state where a first vision module 600 and a second vision module are fixed to the upper plate of the wafer prober according to the embodiment of the present invention.

The first and second vision modules 600 and 602 are fixed to the upper plate of the wafer prober so that the first vision module is mounted at a position at which a wafer camera is to be disposed on the upper plate of the wafer prober and the second vision module is mounted at a position facing the chuck of the stage on which the jig member is disposed. Particularly, the first and second vision modules may be disposed at a predetermined interval.

The interface unit 230 is a multiplex board for selecting a camera and a light of the vision module according to a control instruction transmitted from the central processing unit to supply power and drive the selected camera and the light and selecting and transmitting an image received from the camera to the central processing unit.

The central processing unit 240 controls operations of the vision module via the interface unit 230 or receives one or more images captured for the patterns of the jig member from the vision module. The central processing unit 240 generates mapping data for a position of the stage on which the jig member is disposed using the images of the patterns received from the vision module and stores and manages the mapping data in a data storage unit. In a case where the stage is to be moved to a particular position, the central processing unit corrects movement position information on the stage by using the mapping data stored in the data storage unit and moves the stage according to the corrected movement position information. As a result, irrespective of physical deterioration of the stage, the stage can be accurately moved to the next position from a predetermined reference position.

Figure 7:
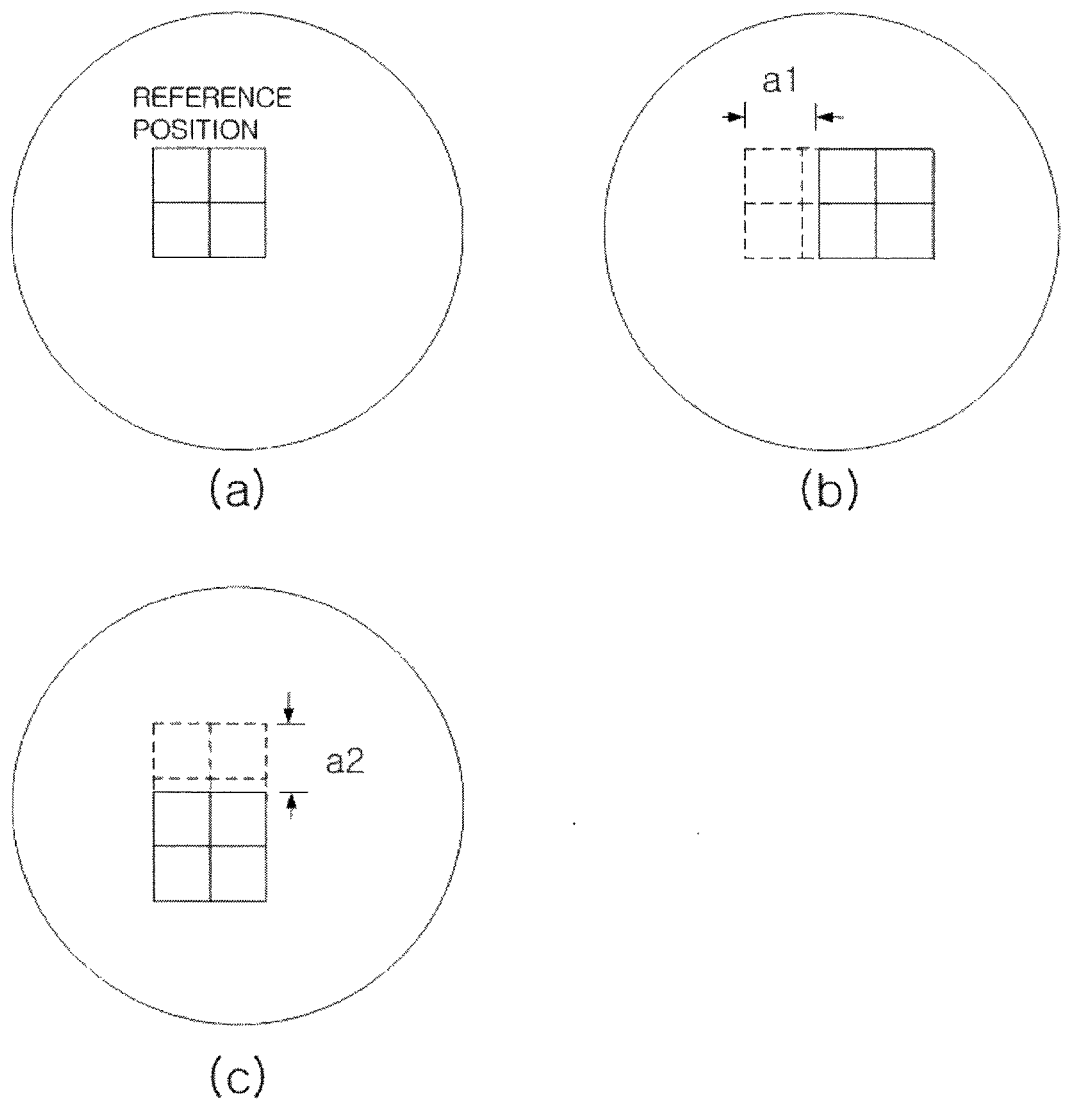
FIG. 7 is a top plan view for explaining a process of detecting error information by the error measurement and correction device according to the embodiment of the present invention.
Figure 8:
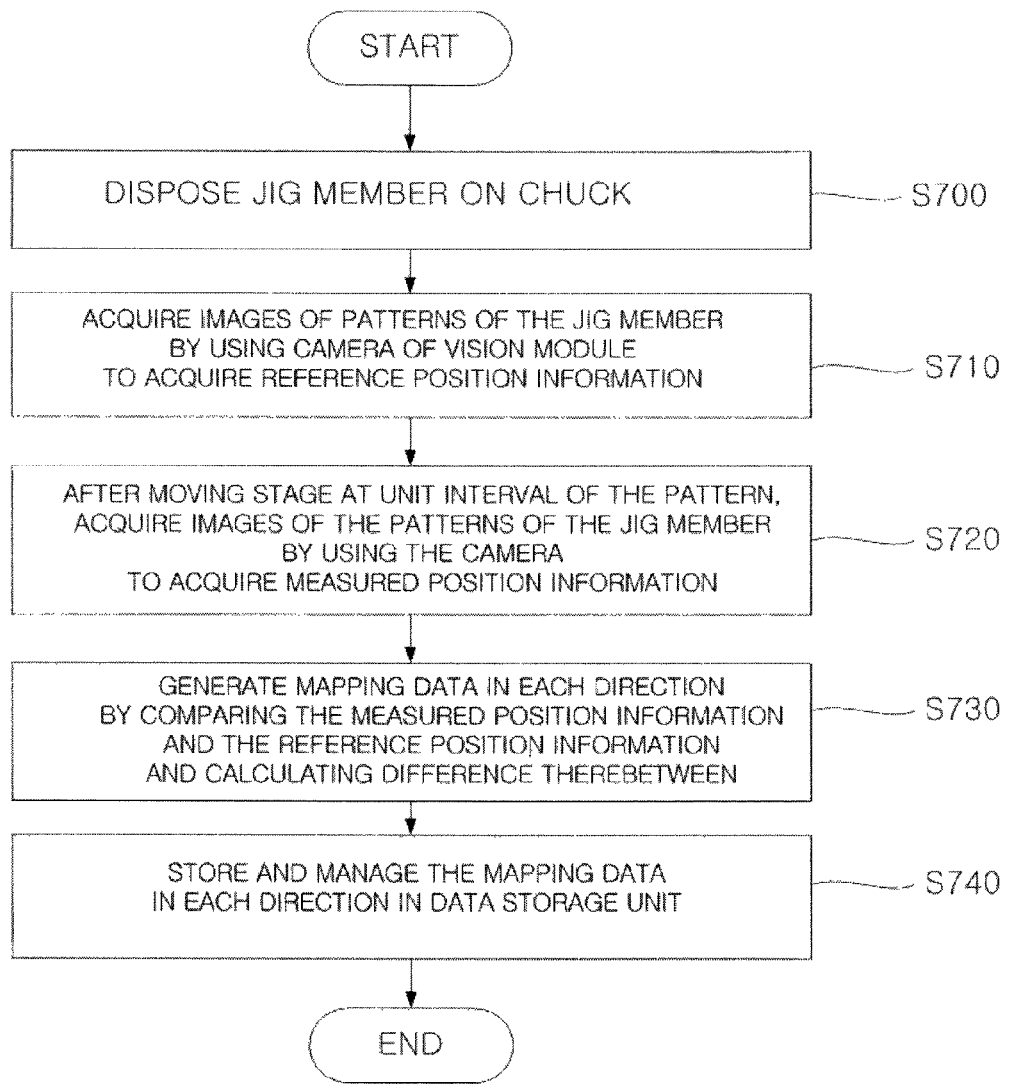
FIG. 8 is a flowchart of a process of generating mapping data by a central processing unit according to the embodiment of the present invention.

Hereinafter, a process of generating the mapping data by the central processing unit is described with reference to FIGS. 7 and 8. FIG. 8 is a flowchart illustrating the process of generating the mapping data by the central processing unit. Referring to FIGS. 7 and 8, the jig member is disposed on the chuck (step 700). Next, as illustrated in FIG. 7a, by using the camera of the vision module, images of the pattern of the jig member are acquired, and by analyzing the acquired images, reference position information in x, y, and z directions is extracted (step 710). Next, after moving the stage in a predetermined direction at a unit interval of the pattern, by using the camera of the vision module, images of the pattern of the jig member are acquired again, and by analyzing the acquired images, measured position information in the x, y, and z directions is extracted (step 720).

Next, mapping data in each direction is generated by comparing the reference position information and the measured position information extracted in each direction and calculating differences therebetween (a1 in FIGS. 7b and a2 in FIG. 7c) (step 730). The generated mapping data is stored in and managed by the data storage unit (step 740). FIG. 7b illustrates a state where a position measured for the pattern of the jig member is moved at a predetermined interval a1 in the x direction with respect to the reference position, and FIG. 7c illustrates a state where a position measured for the pattern of the jig member is moved at a predetermined interval a2 in the y direction with respect to the reference position. The intervals a1 and a2 in FIG. 7 are errors of the stage in the x and y directions, respectively.

Next, a process of correcting the movement position of the stage that is to be moved using the aforementioned mapping data is described with reference to FIG. 9.

Figure 9:
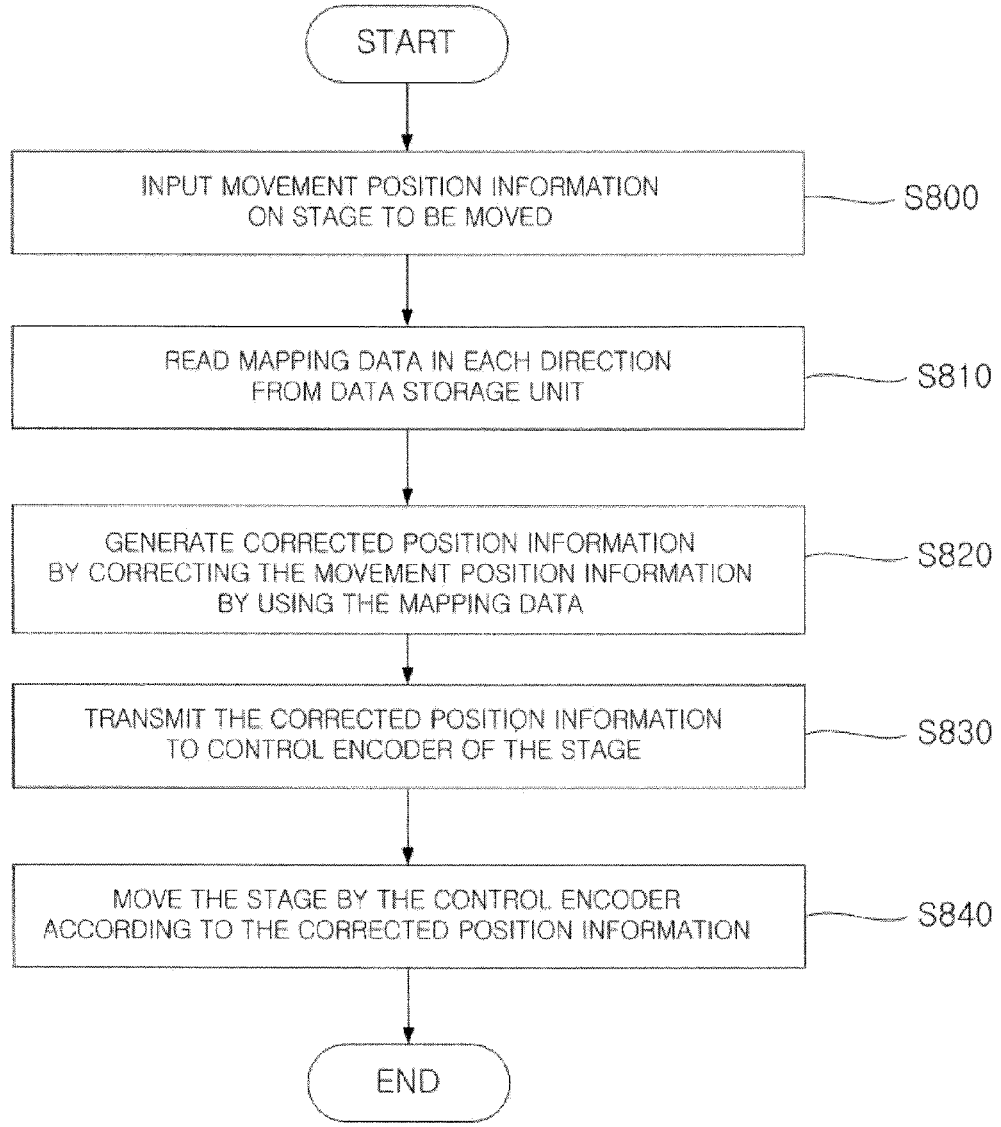
FIG. 9 is a flowchart of a process of correcting a position of a stage to be moved by sing the mapping data when the stage is moved and accurately moving the stage by the central processing unit according to the embodiment of the present invention.

Referring to FIG. 9, in a case where movement position information on a stage that is to be moved is received by the central processing unit (step 800), mapping data on each direction is read from the data storage unit (step 810). Next, by using the read mapping data, the movement position information is corrected, and the corrected position information is generated (step 820). Next, the central processing unit transmits the corrected position information to a control encoder of the stage (step 830).

The control encoder of the stage can accurately move the stage according to the corrected position information transmitted from the central processing unit.

According to the embodiment of the present invention, the error measurement and correction device is described as a single unit. However, according to another embodiment, only an error measurement unit for performing only the error measurement function by generating and storing mapping data on errors in each direction may be separately provided.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

INDUSTRIAL APPLICABILITY

The device according to the present invention can be widely used in a semiconductor wafer prober field.

The invention claimed is:

1. An error measurement and correction device for measuring and correcting movement errors of a stage of a wafer prober, comprising:

a jig member having a surface on which patterns having the same shape are repeatedly formed;

a vision module having a base substrate and one or more cameras mounted on the base substrate; and a central processing unit acquiring one or more images of the patterns of the jig member by using the vision module, generating mapping data between a target movement distance and an actual movement distance of the stage by using the one or more images of the patterns received from the vision module and, and when the stage is to be moved, correcting a position to which the stage is to be moved by using the mapping data and providing the corrected position to a control encoder of the stage, wherein the jig member is disposed on a chuck on the stage, wherein the vision module is disposed on an upper plate of the wafer prober disposed at a position facing the chuck to enable the camera of the vision module to pick up images of the patterns of the jig member on the chuck and transmits the picked images to the central processing unit, and wherein the central processing unit acquires a first image of the jig member disposed on the chuck from the vision module to obtain reference position information based on the first image, moves the stage by a unit length of a pattern of the jig member and then acquires a second image of the jig member to obtain moved position information based on the second image, generates the mapping data by calculating a difference between the reference position information and the moved position information, and stores the generated mapping data in a data storage unit.

2. The error measurement and correction device of claim 1, wherein, when the stage is to be moved, the central processing unit reads the mapping data from the data storage unit, corrects movement position information on the stage by using the read mapping data, and moves the stage according to the corrected movement position information.

3. The error measurement and correction device of claim 1, wherein the vision module includes first and second vision modules mounted to the upper plate of the wafer prober, wherein the first vision module is mounted at a position at which a wafer camera is to be mounted on the upper plate of wafer prober, and wherein the second vision module is mounted at a position facing the chuck of the stage on the upper plate of the wafer prober.

4. The error measurement and correction device of claim 1, further comprising an interface unit disposed between the vision module and the central processing unit, wherein the interface unit drives a particular camera of the vision module according to an instruction received from the central processing unit or transmits images transmitted from the particular camera of the vision module to the central processing unit.

* * * * *